(12) United States Patent
Fang et al.

(10) Patent No.: US 11,387,331 B2
(45) Date of Patent: Jul. 12, 2022

(54) SOURCE/DRAIN CONTACT STRUCTURE

(71) Applicant: Taiwan Semiconductor Manufacturing Co., Ltd., Hsin-Chu (TW)

(72) Inventors: Ting Fang, Hsinchu (TW); Chung-Hao Cai, Hsinchu (TW); Jui-Ping Lin, Hsinchu (TW); Chia-Hsien Yao, Hsinchu (TW); Chen-Ming Lee, Yangmei (TW); Fu-Kai Yang, Hsinchu (TW); Mei-Yun Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/935,686

(22) Filed: Jul. 22, 2020

(65) Prior Publication Data
US 2022/0028983 A1 Jan. 27, 2022

(51) Int. Cl.
| | |
|---|---|
| *H01L 29/40* | (2006.01) |
| *H01L 21/311* | (2006.01) |
| *H01L 21/321* | (2006.01) |
| *H01L 29/06* | (2006.01) |
| *H01L 29/417* | (2006.01) |
| *H01L 29/78* | (2006.01) |

(52) U.S. Cl.
CPC ...... *H01L 29/401* (2013.01); *H01L 21/31144* (2013.01); *H01L 21/32115* (2013.01); *H01L 29/0665* (2013.01); *H01L 29/41725* (2013.01); *H01L 29/41791* (2013.01); *H01L 29/785* (2013.01); *H01L 2029/7858* (2013.01)

(58) Field of Classification Search
CPC ..................... H01L 29/41725; H01L 29/785
See application file for complete search history.

(56) References Cited

U.S. PATENT DOCUMENTS

| | | | |
|---|---|---|---|
| 9,520,362 B2 | 12/2016 | Lin et al. | |
| 9,613,856 B1 | 4/2017 | Yang et al. | |
| 9,716,032 B2 | 7/2017 | Tang et al. | |
| 9,972,529 B2 | 5/2018 | Yang et al. | |
| 10,163,691 B2 | 12/2018 | Shih et al. | |
| 10,170,322 B1 | 1/2019 | Cheng et al. | |
| 2018/0286959 A1* | 10/2018 | Wang | H01L 29/785 |
| 2018/0294184 A1* | 10/2018 | Koh | H01L 21/823431 |
| 2019/0148515 A1* | 5/2019 | Cheng | H01L 29/78654 |
| | | | 257/347 |

* cited by examiner

*Primary Examiner* — Farun Lu
(74) *Attorney, Agent, or Firm* — Haynes and Boone, LLP

(57) ABSTRACT

A method according to the present disclosure includes receiving a workpiece that includes a gate structure, a first gate spacer feature, a second gate spacer feature, a gate-top dielectric feature over the gate structure, the first gate spacer feature and the second gate spacer feature, a first source/drain feature over a first source/drain region, a second source/drain feature over a second source/drain region, a first dielectric layer over the first source/drain feature, and a second dielectric layer over the second source/drain feature. The method further includes replacing a top portion of the first dielectric layer with a first hard mask layer, forming a second hard mask layer over the first hard mask layer while the second dielectric layer is exposed, etching the second dielectric layer to form a source/drain contact opening and to expose the second source/drain feature, and forming a source/drain contact over the second source/drain feature.

19 Claims, 14 Drawing Sheets

SOURCE/DRAIN CONTACT STRUCTURE

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices, such as fin field-effect transistors (FinFETs) and multi-bridge-channel (MBC) transistors, have been introduced in an effort to improve gate control by increasing gate-channel coupling, reduce OFF-state current, and reduce short-channel effects (SCEs). A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

The three-dimensional structure of the multi-gate devices, allows them to be aggressively scaled while maintaining gate control and mitigating SCEs. Aggressive scaling down of IC dimensions has resulted in densely spaced source/drain features. Formation of source/drain contact openings to these densely packed source/drain features demands high overlay precisions and high-aspect-ratio etching, which may reduce process windows and may increase contact resistance to the source/drain features. Thus, although existing techniques are generally adequate for their intended purposes, they are not entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
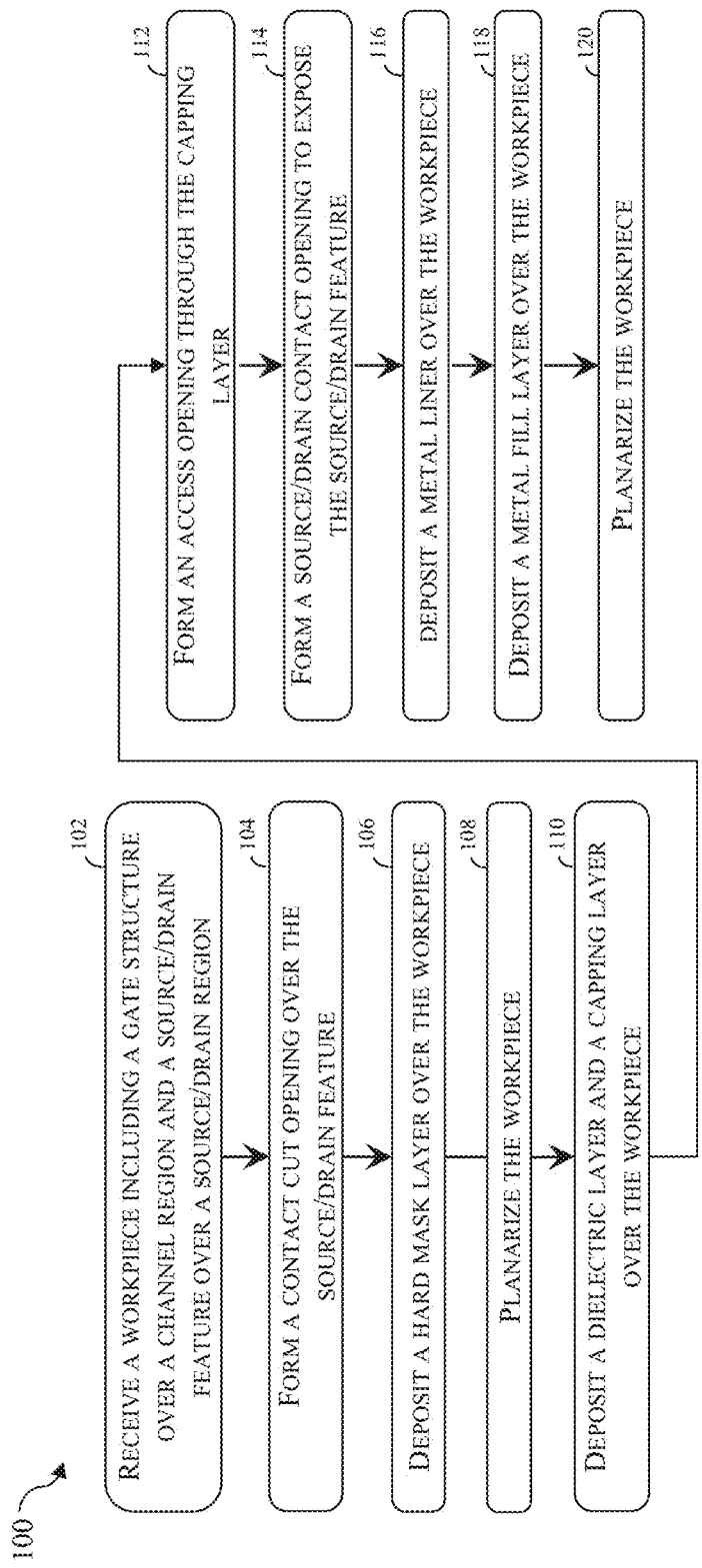
FIG. 1 is a flowchart of a method forming a gate contact in a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

This application relates to semiconductor device structures and methods of forming the same. Particularly, this application relates to self-aligned contact structures and methods.

A contact cut feature refers to a dielectric feature that separates an otherwise elongated contact structure into multiple segments. For example, an elongated source/drain contact may be separated by one or more source/drain contact cut features into multiple segments, each of which is electrically coupled to one or more of underlying source/drain features of multi-gate devices. In some conventional technologies, the source/drain contact cut feature is formed of the interlayer dielectric (ILD) layer. To retain the source/drain contact cut feature, the hard mask for forming the source/drain contact opening needs to cover and protect the source/drain contact cut feature. As a result, formation of the contact opening involves high-aspect-ratio etching that may reduce process tolerance. Additionally, because the source/drain contact opening may taper towards the source/drain feature and have smaller cross-sectional area as the opening progresses downward, high aspect ratios may result in smaller landing area and increased contact resistance.

The present disclosure provides a method to replace at least a top portion of the source/drain contact cut feature with a hard mask layer. The different dielectric material allows selective etching the ILD layer when forming source/drain contact openings. Because the hard mask layer is inlaid into the ILD layer rather than over its top surface, formation of the source/drain contact opening does not require high-aspect-ratio etching and the resultant source/drain contact has an improved landing area.

The various aspects of the present disclosure will now be described in more detail with reference to the figures. Specifically, FIG. 1 illustrates a method 100 for fabricating a semiconductor device from a workpiece 200, fragmentary cross-sectional views of which are illustrated in FIGS. 2-13. Method 100 is merely an example and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Besides what are explicitly shown in figures of the present disclosure, the workpiece 200 may include additional transistors, bipolar junction transistors, resistors, capacitors, diodes, fuses, etc., but is simplified for a better understanding of the inventive concepts of the present disclosure. Throughout the present disclosure, like reference numerals denote like features unless otherwise excepted or described. Because a semiconductor device will be fabricated from the workpiece, the workpiece 200 may be referred to as a semiconductor device 200 as the context requires.

Figure 2:
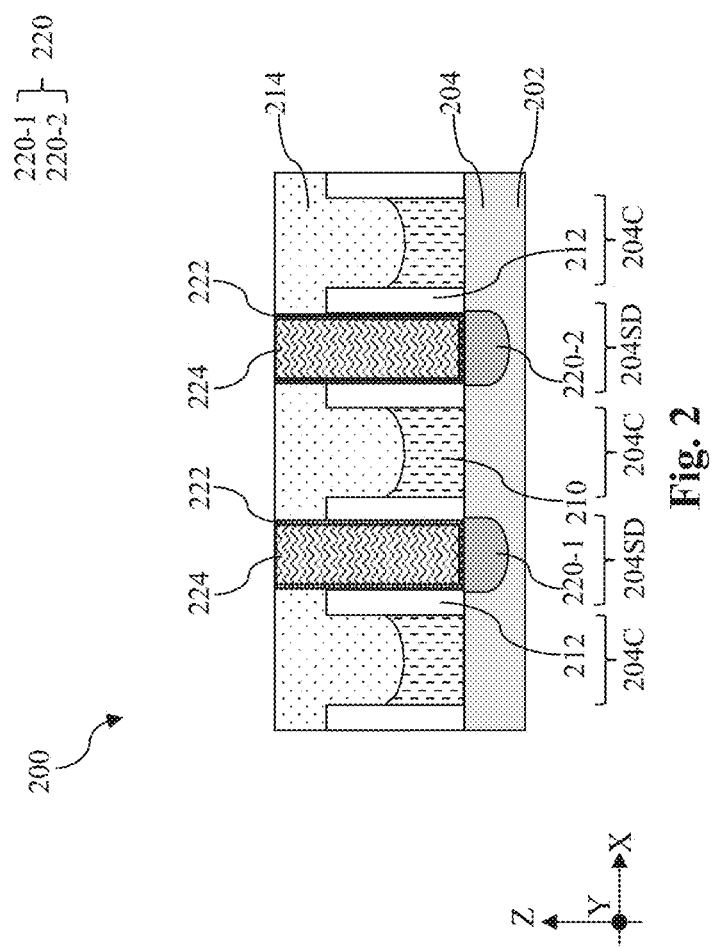
FIGS. 2-13 are fragmentary cross-sectional views of a workpiece at various stages of fabrication according to the method in FIG. 1, according to one or more aspects of the present disclosure.

Referring to FIGS. 1 and 2, method 100 includes a block 102 where a workpiece 200 is received. As shown in FIG. 2, the workpiece 200 includes an active region 204 over a substrate 202. The active region 204 include channel regions 204C and source/drain regions 204SD. As shown in FIG. 2, each of the channel regions 204C may be sandwiched between two source/drain regions 204SD. The workpiece 200 further includes gate structures 210 over channel regions 204C and source/drain features 220 over the source/drain regions 204SD. Here, a first source/drain feature 220-1 and a second source/drain feature 220-2 are shown in FIG. 2. For ease of reference, the first source/drain feature 220-1 and the second source/drain feature 220-2 may be collectively referred to as source/drain features 220. Sidewalls of each of the gate structures 210 are lined with gate spacers 212. Each of the gate structures 210 and the gate spacers 212 sandwiching it are capped by a gate self-aligned contact (SAC) dielectric feature 214. As shown in FIG. 2, the gate SAC dielectric features 214 are disposed on top surfaces of the gate spacers 212 and the gate structures 210. In some embodiments, the active region 204 may be a semiconductor fin of a FinFET or may include a vertical stack of nanostructures of an MBC transistor. When the active region 204 is a semiconductor fin, the gate structure 210 may be disposed over the semiconductor fin and be in contact with three sides of the semiconductor fin. When the active region 204 includes a vertical stack of nanostructures, the gate structure 210 may wrap around each of the nanostructures. The workpiece 200 further includes a contact etch stop layer (CESL) 222 over the source/drain features 220 and an interlayer dielectric (ILD) layer 224. As shown in FIG. 2, the CESL 222 is in contact with the source/drain features 220, the gate spacers 212, and the gate SAC dielectric features 214. The ILD layer 224 is separated from the source/drain features 220, the gate spacers 212, and the gate SAC dielectric features 214 by the CESL 222.

The substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

The active region 204 may include silicon (Si) or another elementary semiconductor, such as germanium (Ge); a compound semiconductor such as silicon carbide (SiC), gallium arsenide (GaAs), gallium phosphide (GaP), indium phosphide (InP), indium arsenide (InAs), and/or indium antimonide (InSb); an alloy semiconductor such as silicon germanium (SiGe), gallium arsenic phosphorus (GaAsP), aluminum indium arsenic (AlInAs), aluminum gallium arsenic (AlGaAs), indium gallium arsenic (InGaAs), gallium indium phosphorus (GaInP), and/or gallium indium arsenic phosphorus (GaInAsP); or combinations thereof. As shown in FIG. 2, the active region 204 extend lengthwise along the X direction. The active region 204 may be fabricated using suitable processes including photolithography and etch processes. The photolithography process may include forming a photoresist layer overlying the substrate 202, exposing the photoresist layer to radiation reflected from or transmitting through a photomask, performing post-exposure bake processes, and developing the photoresist layer to form a masking element including the photoresist layer. In some embodiments, patterning the photoresist layer to form the masking element may be performed using an electron beam (e-beam) lithography process. The masking element may then be used to protect regions of the substrate 202 while an etch process forms recesses into the substrate 202, thereby forming the active region 204. The recesses may be etched using a dry etch (e.g., chemical oxide removal), a wet etch, and/or other suitable processes. Numerous other embodiments of methods to form the active region 204 on the substrate 202 may also be used. In embodiments where the active region 204 are a vertical stack of nanostructures of an MBC transistor, first semiconductor layers and second semiconductors layer are first alternatingly and epitaxially deposited on the substrate 202 to form a layer stack. The first semiconductor layer and the second semiconductor layer have different compositions. For example, the first semiconductor layer may include silicon (Si) and the second semiconductor layer may include silicon germanium (SiGe). The layer stack having first semiconductor nanostructures and second semiconductor nanostructures is then patterned to form fin-shaped structure. The second semiconductor layers in the channel regions of fin-shaped structure are then selectively removed to release the first semiconductor layers into suspended nanostructures.

Gate structures 210 are disposed over channel regions 204C of the active region 204. As illustrated in FIG. 2, the gate structures 210 extend lengthwise along Y direction, which is perpendicular to the X direction. While not shown in FIG. 2, each of the gate structures 210 includes an interfacial layer, a gate dielectric layer, one or more work function layers, and a metal fill layer. In some embodiments, the interfacial layer may include a dielectric material such as silicon oxide or silicon hafnium oxide. The gate dielectric layer is formed of a high-k (i.e., dielectric constant greater than about 3.9) dielectric material that may include hafnium oxide (HfO), titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co), nickel (Ni), or copper (Cu). Because the gate dielectric layer is formed of high-k dielectric material and the use of metal in gate structures 210, gate structures 210 may also be referred to high-k metal gate structures 210 or metal gate structures 210.

In some embodiments, the gate spacer 212 may be a single layer or a multi-layer. Example materials for the gate spacer 212 include silicon oxide, silicon nitride, silicon carbide, silicon oxynitride, silicon carbonitride, silicon oxycarbide, silicon oxycarbonitride, and/or combinations thereof. The material for the gate spacer 212 is selected such that the gate spacer 212 and the ILD layer 224 have different etching selectivity. That is, the selection of materials allows each of the gate spacer 212 or the ILD layer 224 to be selectively etched without substantially damaging the other. In one example, the gate spacer 212 is formed of silicon nitride.

The source/drain features 220 may be epitaxially grown over the source/drain regions 204SD of the active region 204. Depending on the device types and design requirements, the source/drain features 220 may be n-type or p-type. For example, n-type source/drain features 220 may include silicon (Si) doped with an n-type dopant, such as phosphorous (P) or arsenic (As) and p-type source/drain features 220 may include silicon germanium (SiGe) doped with a p-type dopant, such as boron (B). The source/drain features 220 include a first source/drain feature 220-1 and a second source/drain feature 220-2, which are disposed on different sides of the channel region 204C.

The ILD layer 224 may be a silicon oxide or silicon oxide containing material where silicon exists in various suitable forms. As an example, the ILD layer 224 includes silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

The gate SAC dielectric features 214 may be formed of silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. In one embodiment, the gate SAC dielectric features 214 is formed of silicon nitride. In some embodiments, the gate SAC dielectric features 214 may be referred to as a gate capping layer 214. Although not explicitly shown in the figures, in some embodiments, a liner may be deposited over the gate structures 210 and the gate spacers 212 before the deposition of the gate SAC dielectric feature 214. The liner may include silicon oxide, hafnium silicide, silicon oxycarbide, aluminum oxide, zirconium silicide, aluminum oxynitride, zirconium oxide, hafnium oxide, hafnium zirconium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. When the liner is formed, the gate SAC dielectric features 214 and the liner have different compositions such that the gate SAC dielectric features 214 may be selectively etched without substantially etching the liner.

Figure 3:
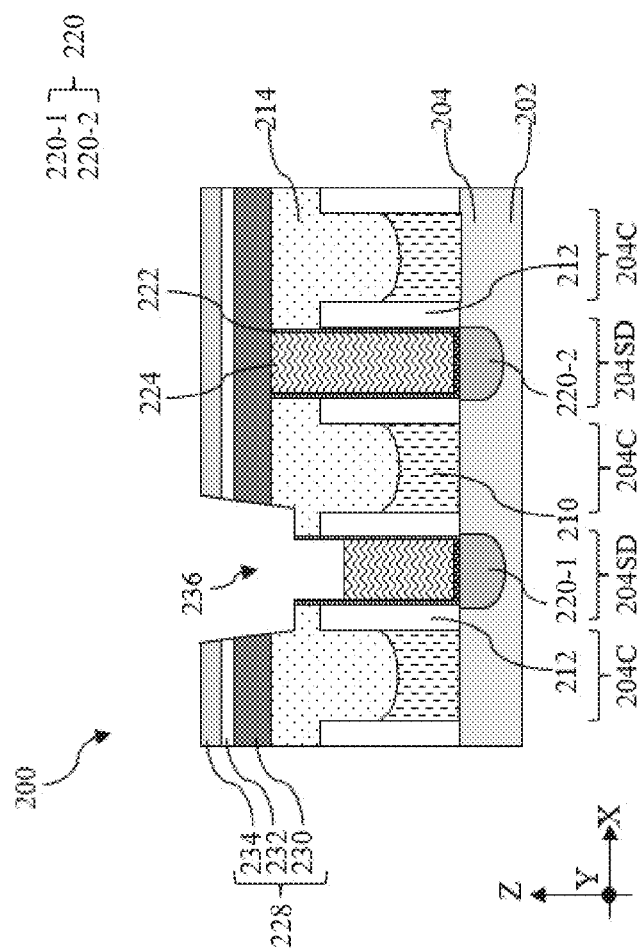

Referring to FIGS. 1 and 3, method 100 includes a block 104 where a contact cut opening 236 is formed over the first source/drain feature 220-1. In some embodiments, the formation of the contact cut opening 236 may include photolithography processes and etch processes. In some instances, a first resist layer 228 may be deposited over the workpiece 200. The first resist layer 228 may be a single layer or a multi-layer. In some embodiments represented in FIG. 3, the first resist layer 228 is a tri-layer and may include a bottom layer 230, a middle layer 232 over the bottom layer 230, and a top layer 234 over the middle layer 232. In one embodiment, the bottom layer 230 may be a carbon-rich polymer layer that includes carbon (C), hydrogen (H) and oxygen, the middle layer may be a silicon-rich polymer layer including silicon (Si), carbon (C), hydrogen (H), and oxygen (O), and the top layer may be photosensitive polymer layer that includes carbon (C), hydrogen (H) and oxygen (O), and a photosensitive component. To pattern the first resist layer 228, the top layer 234 is first exposed to a radiation reflected from or transmitting through a photomask, baked in a post-exposure bake process, developed in a development process, and rinsed. The pattern of the photomask is thereby transferred to the top layer 234. The patterned top layer 234 is used as an etch mask during the etching the middle layer 232 and the patterned middle layer 232 is used as an etch mask for the patterning of the bottom layer 230. As shown in FIG. 3, the patterned first resist layer 228 includes an opening over the first source/drain feature 220-1. The gate SAC dielectric feature 214, the gate spacer 212, the CESL 222, and the ILD layer 224 exposed in the opening are then recessed using the patterned first resist layer 228 as an etch mask to form the contact cut opening 236 over the first source/drain feature 220-1. In some embodiments, the recessing at block 104 may be a dry etch process. For example, the dry etch process may implement an oxygen-containing gas, hydrogen, a fluorine-containing gas (e.g., CF$_4$, SF$_6$, CH$_2$F$_2$, CHF$_3$, CH$_3$F, C$_4$H$_8$, C$_4$F$_6$, and/or C$_2$F$_6$), a carbon-containing gas (e.g., CO, CH$_4$, and/or C$_3$H$_8$), a chlorine-containing gas (e.g., Cl$_2$, CHCl$_3$, CCl$_4$, and/or BCl$_3$), a bromine-containing gas (e.g., HBr and/or CHBR$_3$), an iodine-containing gas, other suitable gases and/or plasmas, and/or combinations thereof.

The contact cut opening 236 reduces the height of the ILD layer 224 over the first source/drain feature 220-1 and creates space defined by a top surface of the ILD layer 224 and sidewalls of the CESL 222. In some embodiments represented in FIG. 3, the contact cut opening 236 does not taper between the CESL 222 over the top surface of the ILD layer 224. In other embodiments illustrated in FIGS. 12 and 13 (to be described below), the contact cut opening 236 may taper toward the substrate 202 and may extend partially into the ILD layer 224 or may extend all the way through the depth of the ILD layer 224. Although not explicitly shown in FIG. 3, the first resist layer 228 is removed by ashing or a suitable method after the formation of the contact cut opening 236.

Figure 4:
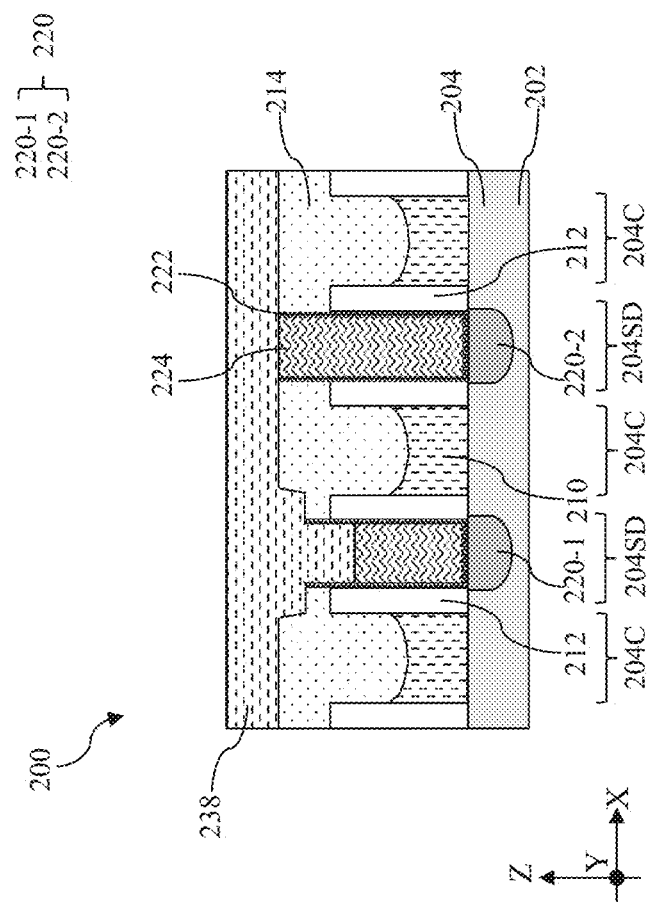

Referring to FIGS. 1 and 4, method 100 includes a block 106 where a hard mask layer 238 is deposited over the workpiece 200. As shown in FIG. 4, the hard mask layer 238 is deposited into the contact cut opening 236 and is in contact with the top surface of the CESL 222 and the ILD layer 224 over the first source/drain feature 220-1. In some embodiments, the composition of the hard mask layer 238 may be different from the composition of the ILD layer 224 such that the ILD layer 224 may be selectively etched. In some embodiments, the hard mask layer 238 may include silicon nitride, silicon, silicon carbide, silicon oxycarbonitride, or silicon carbonitride while the ILD layer 224 may be formed of silicon oxide. In one embodiment, the hard mask layer 238 includes silicon nitride. In some implementations, the hard mask layer 238 may be deposited using atomic layer deposition (ALD), high density plasma chemical vapor deposition (HDPCVD), plasma-enhanced CVD (PECVD), plasma-enhanced ALD (PEALD), or a suitable deposition method that has good hole filling capability. In some embodiments represented in FIG. 4, the hard mask layer 238 is disposed on the gate SAC dielectric features 214, the CESL 222, and the ILD layer 224. In some implementations, the hard mask layer 238 is formed to have a minimum thickness from the top surface of the gate SAC dielectric feature 214. In some instances, the minimum thickness may be between about 10 nm and about 25 nm. The minimum thickness allows improved control of the following planarization process.

Figure 5:
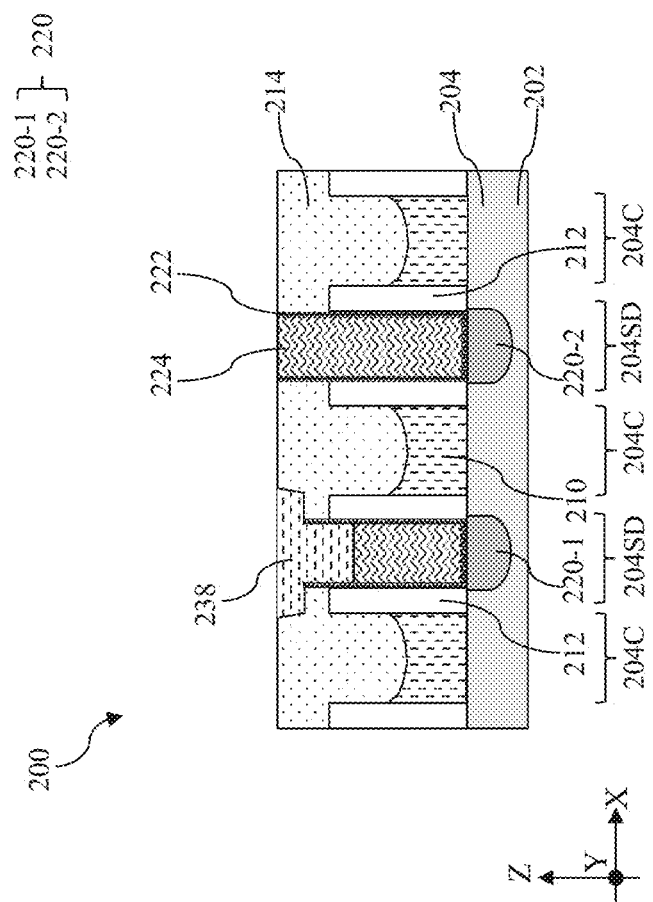

Referring to FIGS. 1 and 5, method 100 includes a block 108 where the workpiece 200 is planarized. At block 108, the hard mask layer 238 deposited at block 106 is pulled back by a planarization process, such as a chemical mechanical polishing (CMP) process. As shown in FIG. 5, the hard mask layer 238 over the gate SAC dielectric features 214 and over the second source/drain feature 220-2 is removed. As a result, top surfaces of the gate SAC dielectric features 214, the top surface of the hard mask layer 238 over the first source/drain feature 220-1, the top surface of the ILD layer 224 over the second source/drain feature 220-2, the top surface of the CESL 222 over the second source/drain feature 220-2 are coplanar.

Reference is now made to FIGS. 2 and 5. It can be seen that operations at block 104, 106, and 108 replace a top portion of the ILD layer 224 over the first source/drain feature 220-1 with the hard mask layer 238. That is, instead of depositing a hard mask layer over the ILD layer 224, the hard mask layer 238 is inlaid into the ILD layer 224. In FIG. 2, there is no etch selectivity between the ILD layer 224 over the first source/drain feature 220-1 and the ILD layer 224 over the second source/drain feature 220-2. Turning to FIG. 5, while the ILD layer 224 over the second source/drain feature 220-2 remains exposed, the ILD layer 224 over the first source/drain feature 220-1 is protected by the hard mask layer 238. Because the hard mask layer 238 has a different composition from the ILD layer 224, the hard mask layer 238 allow selective etching of the ILD layer 224 over the second source/drain feature 220-2.

Figure 6:
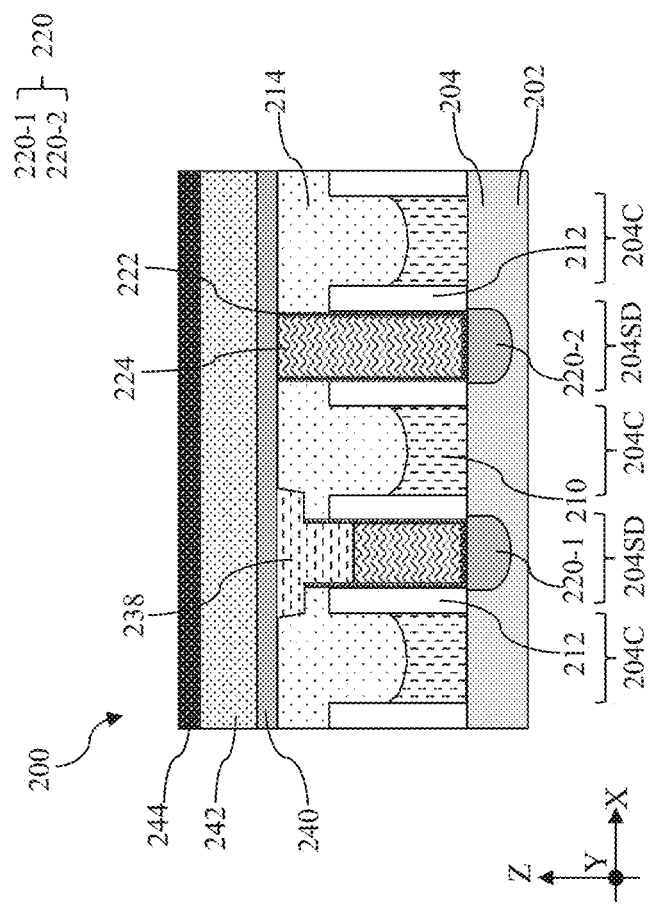

Referring to FIGS. 1 and 6, method 100 includes a block 110 where a dielectric layer 242 and a capping layer 244 are deposited over the workpiece 200. In some embodiments, a composition of the dielectric layer 242 may be similar to that of the ILD layer 224. In some instances, the dielectric layer 242 may include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. The capping layer 244 may include tungsten carbide, aluminum oxide, zirconium oxide, zinc oxide, titanium oxide, tantalum oxide, hafnium oxide, or a suitable material. In one embodiment, the capping layer 244 includes tungsten carbide. In some embodiments, the dielectric layer 242 may be deposited using spin-on coating or CVD and the capping layer 244 may be deposited using ALD or CVD.

Figure 7:
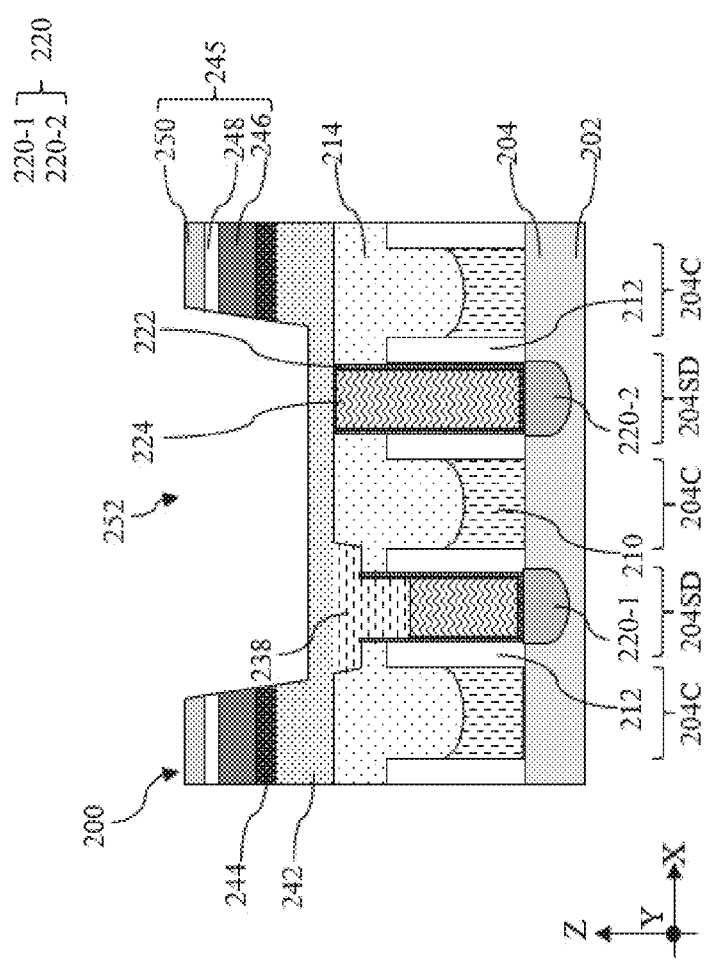

Referring to FIGS. 1 and 7, method 100 includes a block 112 where an access opening 252 through the capping layer 244 is formed. Like operations at block 104, operations at block 112 may include photolithography and etch processes. At block 112, a second resist layer 245 is deposited on the capping layer 244 over the workpiece 200. As shown in FIG. 7, the second resist layer 245 is a tri-layer and includes a bottom layer 246, a middle layer 248 over the bottom layer 246, and a top layer 250 over the middle layer 248. The compositions of the bottom layer 246, the middle layer 248, and the top layer 250 are similar to those of the bottom layer 230, the middle layer 232, and the top layer 234 in the first resist layer 228 described above and will not be repeated here. After the second resist layer 245 is patterned in a fashion similar to the patterning of the first resist layer 228, the workpiece 200 is etched using the patterned second resist layer 245 as an etch mask to form the access opening 252. The access opening 252 extends through the capping layer 244 and partially into the dielectric layer 242. The etch process for forming the access opening 252 may include an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The access opening 252 spans over both the first source/drain feature 220-1 and the second source/drain feature 220-2. Although not explicitly shown in the figures, the second resist layer 245 is removed by ashing or a suitable method after the formation of the access opening 252.

Figure 8:
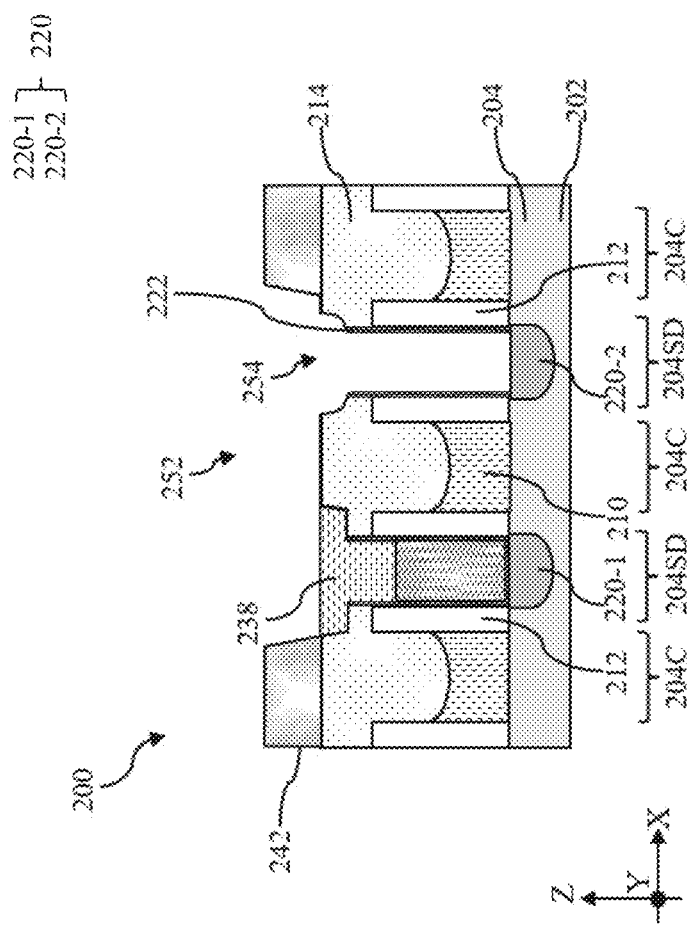

Referring to FIGS. 1 and 8, method 100 includes a block 114 where a source/drain contact opening 254 to the second source/drain feature 220-2 is formed. At block 114, the CESL 222 and the ILD layer 224 over the second source/drain feature 220-2 are removed in a self-aligned manner to form the source/drain contact opening 254. Such self-alignment is achieved by the etch selectivity of the ILD layer 224 relative to the capping layer 244 (shown in FIG. 7), the hard mask layer 238, and the gate SAC dielectric feature 214. In some embodiments, the etching/removal of the ILD layer 224 may be performed using an anisotropic dry etch process. Example dry etch process may include an oxygen-containing gas, hydrogen, a fluorine-containing gas (e.g., $CF_4$, $SF_6$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 8, the anisotropic dry etch also removes the CESL 222 over the second source/drain feature 220-2 to expose the second source/drain feature 220-2.

Figure 9:
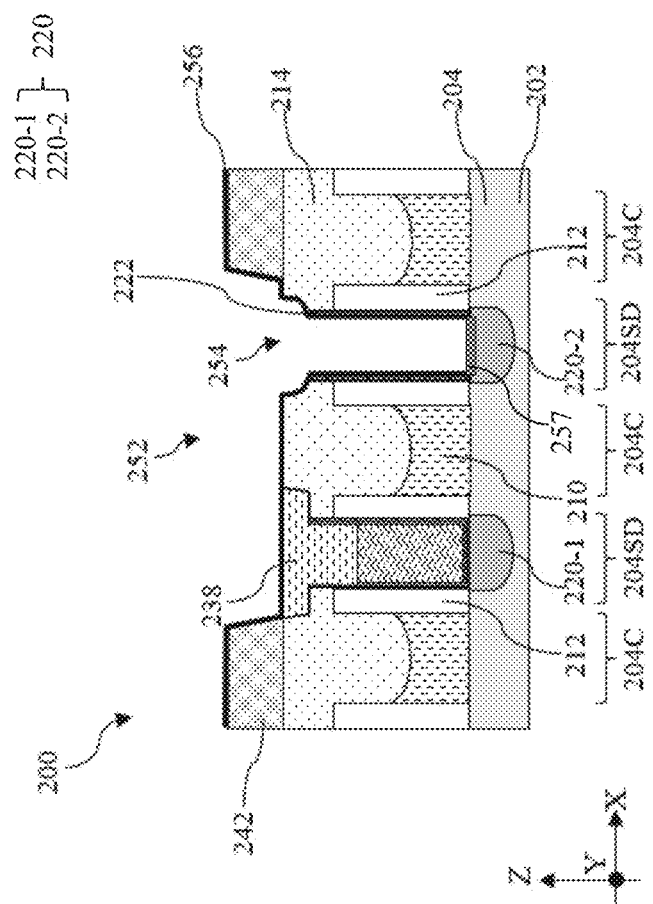

Referring to FIGS. 1 and 9, method 100 includes a block 116 where a metal liner 256 is deposited over the workpiece 200. The metal liner 256 may include nickel (Ni), cobalt (Co), tantalum (Ta), or titanium (Ti) and may serve as a silicide precursor. As the metal liner 256 is deposited over the workpiece 200, it is disposed on and in contact with the exposed second source/drain feature 220-2. The workpiece 200 is then annealed to bring about silicidation reaction between silicon in the second source/drain feature 220-2 and the metal liner 256. The silicidation reaction results in a silicide feature 257 at the interface between the metal liner 256 and the second source/drain feature 220-2. In some instance, the silicide feature 257 may include nickel silicide, cobalt silicide, tantalum silicide, or titanium silicide. The silicide feature 257 may reduce the contact resistance between the second source/drain feature 220-2 and a metal fill layer 258 (shown in FIG. 10) to be deposited over the silicide feature 257. In one embodiment, the metal liner 256 is formed of titanium and the silicide feature 257 is formed of titanium silicide. The metal liner 256 may be deposited using PVD or a suitable deposition method.

Figure 10:
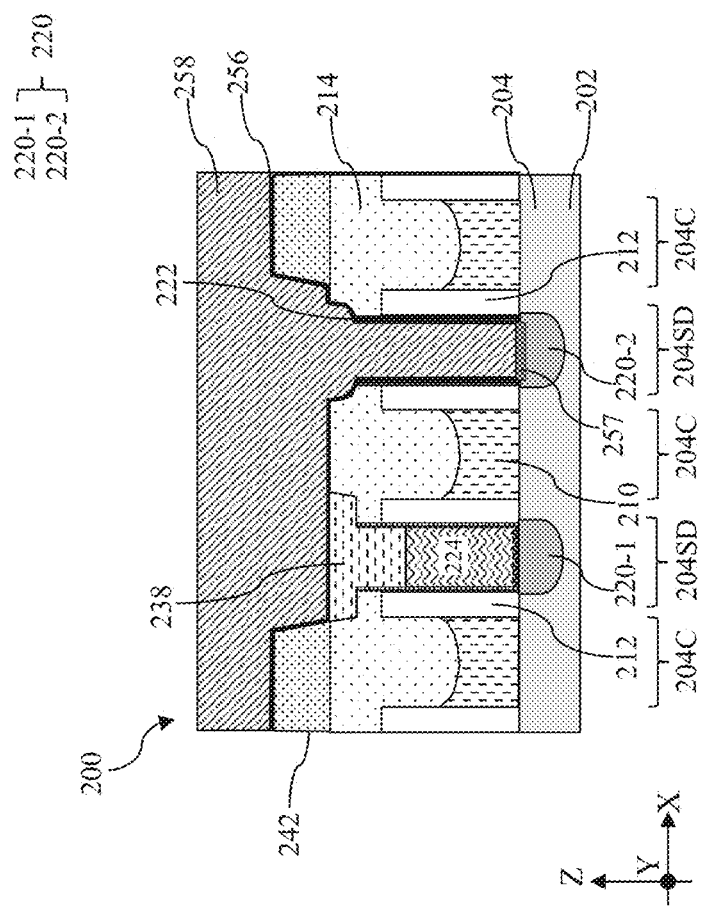

Referring to FIGS. 1 and 10, method 100 includes a block 118 where a metal fill layer 258 is deposited over the workpiece 200. In some embodiment, the metal fill layer 258 may include tungsten (W), ruthenium (Ru), cobalt (Co), copper (Cu), titanium (Ti), titanium nitride (TiN), tantalum (Ta), tantalum nitride (TaN), molybdenum (Mo), or nickel (Ni) and may be deposited using PVD or a suitable deposition method. As shown in FIG. 10, the metal fill layer 258 is blanketly deposited over the workpiece 200, including in the source/drain contact opening 254 (shown in FIG. 9).

Figure 11:
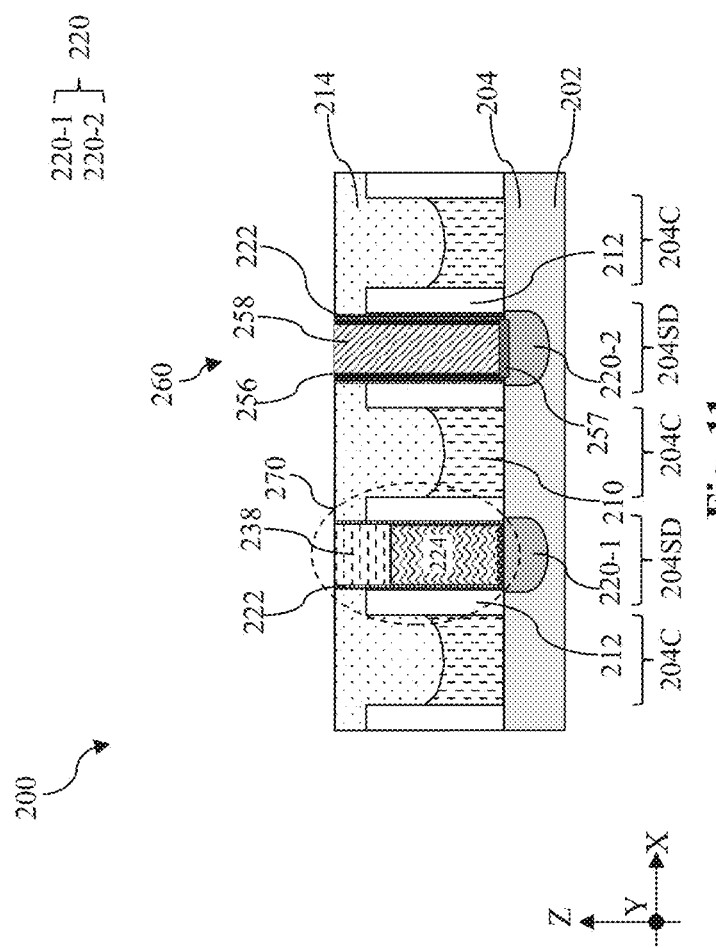

Referring to FIGS. 1 and 11, method 100 includes a block 120 where further processes are performed. Such further processes may include planarization of the workpiece 200, formation of gate contacts, and formation of an interconnect structure over the workpiece 200. FIG. 11 illustrates the planarization of the workpiece 200 after the deposition of the metal fill layer 258. The planarization may include use of a CMP process. As shown in FIG. 11, the planarization is performed until top surfaces of the gate SAC dielectric features 214, the hard mask layer 238, the metal liner 256, and the metal fill layer 258 are coplanar. At the conclusion of the planarization, a first source/drain contact 260 is substantially formed. The first source/drain contact 260 is coupled to the second source/drain feature 220-2. After the planarization at block 120, the remaining hard mask layer 238 directly over the ILD layer 224 over the first source/drain feature 220-1 may be referred to as the hard mask feature 238. The hard mask feature 238 and the ILD layer 224 directly below it may be collectively regarded as a first contact cut feature 270.

Figure 12:
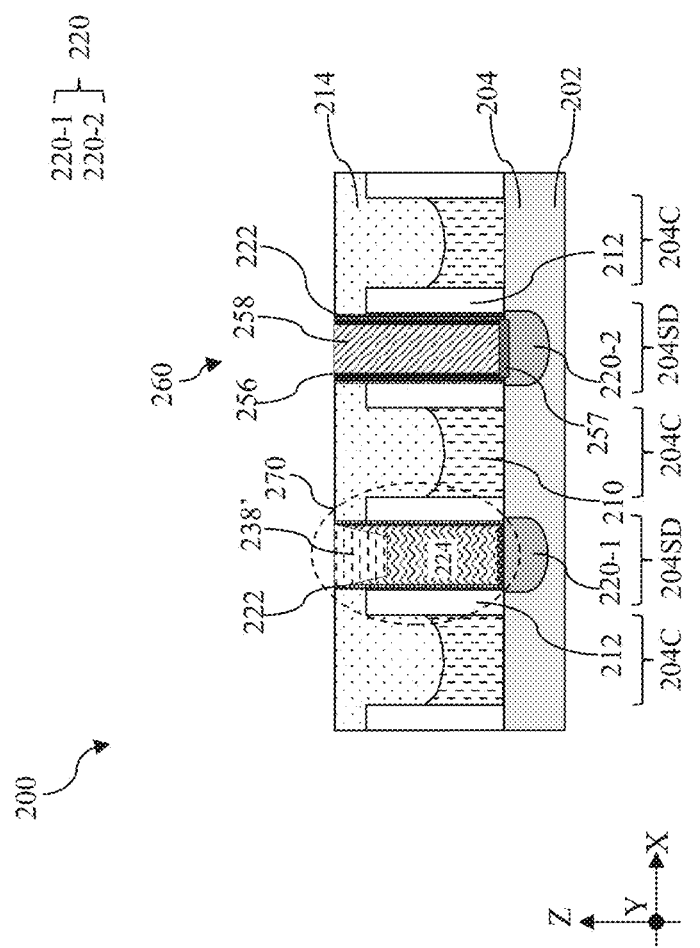
Figure 13:
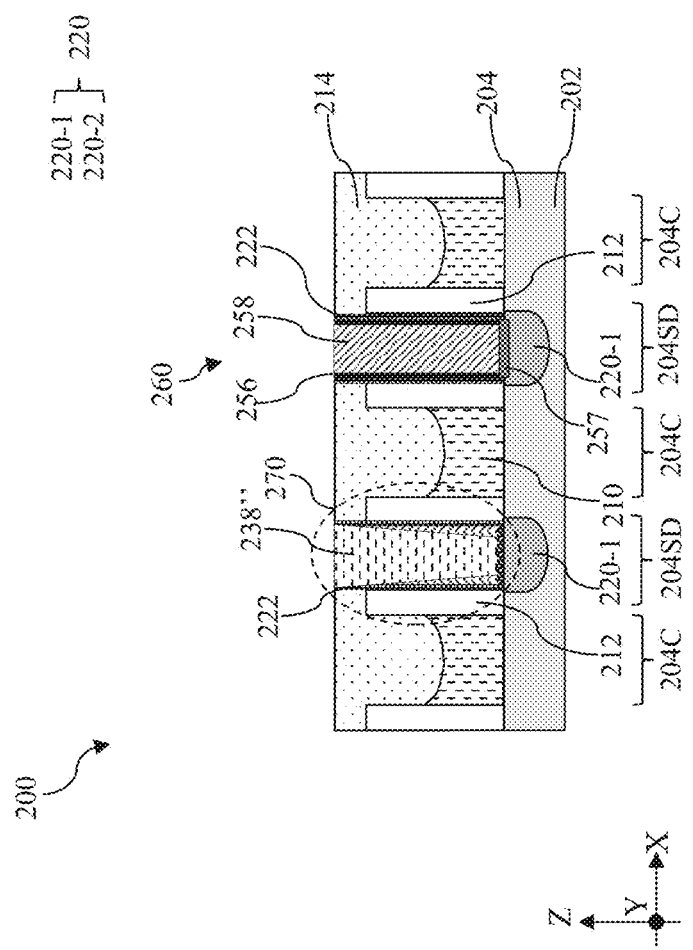

FIGS. 12 and 13 illustrate alternative embodiments of the structures shown in FIG. 11. In some instances, the contact cut opening 236 shown in FIG. 3 may taper toward the first source/drain feature 220-1 and may extend all the way through the ILD layer 224 over the first source/drain feature 220-1. In an alternative embodiment shown in FIG. 12, the semiconductor device 200 includes a first tapering hard mask feature 238' that tapers toward the first source/drain feature 220-1. In another alternative embodiment shown in FIG. 13, the semiconductor device 200 includes a second tapering hard mask feature 238" that tapers toward the first source/drain feature 220-1 and extends all the way through the depth of the ILD layer 224 over the first source/drain feature 220-1. As shown in FIGS. 12 and 13, because of the tapering shapes, the first tapering hard mask feature 238' and the second tapering hard mask feature 238" do not completely displace the ILD layer 224. Instead, a majority portion of them, other than the top portion, are spaced apart from the CESL 222 by the remaining ILD layer 224 along the sidewall of the CESL 222. That is, a portion of the ILD layer 224 may extend between the first tapering hard mask feature 238' and the CESL 222 or between the second tapering hard mask feature 238" and the CESL 222. In the alternative embodiment shown in FIG. 12, the first contact cut feature 270 may include the first tapering hard mask feature 238' and the ILD layer 224 below it. In the other alternative embodiment shown in FIG. 13, the first contact cut feature 270 may include the second tapering hard mask feature 238" and the surrounding ILD layer 224.

Figure 14:
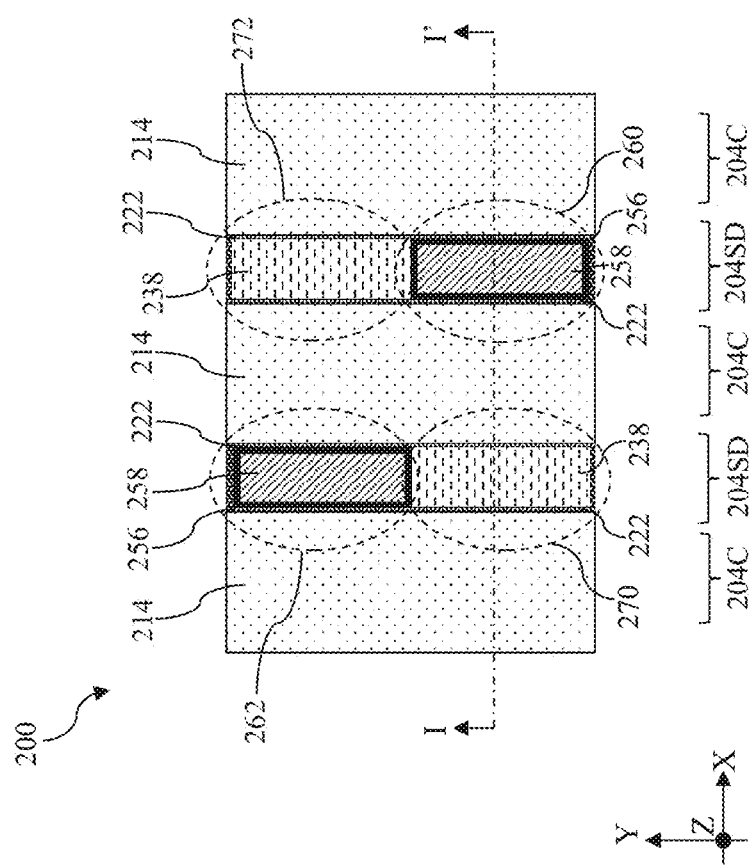
FIG. 14 is a fragmentary top view of the workpiece in FIG. 11, 12, or 13, according to one or more aspects of the present disclosure.

FIG. 14 is a fragmentary top view of the workpiece 200 shown in FIG. 11, 12, or 13. FIG. 14 illustrates a cross-section I-I', which coincides with the cross-sectional planes illustrated in FIGS. 11, 12 and 13. From left to right, the cross-section I-I' cuts across the gate SAC dielectric feature 214, the first contact cut feature 270, another gate SAC dielectric feature 214, and the first source/drain contact 260. In some embodiments represented in FIG. 14, the first contact cut feature 270 is aligned with a second source/drain contact 262 along the Y direction. The hard mask feature 238 (or the first tapering hard mask feature 238' in FIG. 12, or the second tapering hard mask feature 238" in FIG. 13) protects the underlying ILD layer 224 when the source/drain contact openings for the first source/drain contact 260 and the second source/drain contact 262 are etched. Put differently, the hard mask feature 238 (or the first tapering hard mask feature 238' in FIG. 12, or the second tapering hard mask feature 238" in FIG. 13) prevents the deposition of the metal liner 256 and the metal fill layer 258. As a result, the hard mask feature 238 (or the first tapering hard mask feature 238' in FIG. 12, or the second tapering hard mask feature 238" in FIG. 13) cuts off the second source/drain contact 262. Similarly, the first source/drain contact 260 is aligned with a second contact cut feature 272 along the Y direction. The second contact cut feature 272 cuts short the first source/drain contact 260.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include replacing at least a top portion of an ILD layer with a hard mask feature. The hard mask feature protects the underlying ILD layer during selective contact opening formation processes. Because the hard mask feature is inlaid into the ILD layer, rather than deposited over the ILD layer, formation of the contact openings does not involve high-aspect-ratio etching. As a result, embodiments of the present disclosure may improve process windows and contact landing areas.

Thus, one of the embodiments of the present disclosure provides a method. The method includes receiving a workpiece having a gate structure disposed over a channel region of an active region, a first gate spacer feature disposed along a first sidewall of the gate structure, a second gate spacer feature disposed along a second sidewall of the gate structure, the second sidewall opposing the first sidewall, a gate-top dielectric feature over the gate structure, the first gate spacer feature and the second gate spacer feature, a first source/drain feature disposed over a first source/drain region of the active region, a second source/drain feature disposed over a second source/drain region of the active region, a first dielectric layer over the first source/drain feature, and a second dielectric layer over the second source/drain feature. The method further includes forming a contact cut opening over the first source/drain feature while the second dielectric layer is masked, the contact cut opening extending into the first dielectric layer, depositing a hard mask layer over the workpiece, after the depositing of the hard mask layer, planarizing the workpiece to expose the second dielectric layer, forming a source/drain contact opening through the second dielectric layer to expose the second source/drain feature, and forming a source/drain contact in the source/drain contact opening.

In some embodiments, the first dielectric layer and the second dielectric layer include silicon oxide. The first gate spacer feature, and the second gate spacer feature, the gate-top dielectric feature, and the hard mask layer include silicon nitride. In some embodiments, after the planarizing of the workpiece, the first source/drain feature underlies the hard mask layer and the first dielectric layer and the second source/drain feature underlies the second dielectric layer. In some implementations, the workpiece further includes a contact etch stop layer (CESL) disposed between the first dielectric layer and the first source/drain feature and between the second dielectric layer and the second source/drain feature. In some embodiments, the channel region of the active region includes a fin-like structure. In some instances, the channel region of the active region includes a vertical stack of nanostructures and the gate structure wraps around each of the vertical stack of nano structures. In some instances, a composition of the hard mask layer is different from a composition of the second dielectric layer. In some embodiments, after the planarizing of the workpiece, a top surface of the hard mask layer is coplanar with a top surface of the gate-top dielectric feature. In some implementations, the forming of the source/drain contact opening includes depositing a top dielectric layer over the workpiece, depositing a tungsten carbide layer over the top dielectric layer, forming an access opening through the tungsten carbide layer, the access opening being over the hard mask layer and the second dielectric layer, and selectively etching the second dielectric layer.

In another of the embodiments, a method is provided. The method includes receiving a workpiece having a gate structure disposed over a channel region of an active region, a first gate spacer feature disposed along a first sidewall of the gate structure, a second gate spacer feature disposed along a second sidewall of the gate structure, the second sidewall opposing the first sidewall, a gate-top dielectric feature over the gate structure, the first gate spacer feature and the second gate spacer feature, a first source/drain feature disposed over a first source/drain region of the active region, a second source/drain feature disposed over a second source/drain region of the active region, a first dielectric layer over the first source/drain feature, and a second dielectric layer over the second source/drain feature. The method further includes replacing a top portion of the first dielectric layer with a hard mask layer, selectively etching the second dielectric layer to form a source/drain contact opening and to expose the second source/drain feature, and after the selectively etching of the second dielectric layer, forming a source/drain contact over the second source/drain feature.

In some embodiments, the first dielectric layer and the second dielectric layer include silicon oxide and the first gate spacer feature, and the second gate spacer feature, the gate-top dielectric feature, and the hard mask layer include silicon nitride. In some implementations, the replacing includes forming a contact cut opening over the first source/drain feature while the second dielectric layer is masked, the contact cut opening displacing the top portion of the first dielectric layer, depositing the hard mask layer over the contact cut opening, and planarizing the workpiece until a top surface of the hard mask layer is coplanar with a top surface of the second dielectric layer. In some implementations, a composition of the hard mask layer is different from a composition of the second dielectric layer. In some instances, the forming of the source/drain contact includes forming a silicide layer over the workpiece and on the second source/drain feature, depositing a metal fill layer over the silicide layer, and planarizing the workpiece until a top surface of the metal fill layer is coplanar with the top surface of the hard mask layer. In some instances, the selectively etching includes depositing a top dielectric layer over the workpiece, depositing a tungsten carbide layer over the top dielectric layer, forming an access opening through the tungsten carbide layer, the access opening being over the hard mask layer and the second dielectric layer, and selectively etching the second dielectric layer.

In yet another of the embodiments, a semiconductor device is provided. The semiconductor device includes a gate structure disposed over a channel region of an active region, a first gate spacer feature disposed along a first sidewall of the gate structure, a second gate spacer feature disposed along a second sidewall of the gate structure, the second sidewall opposing the first sidewall, a gate-top dielectric feature over the gate structure, the first gate spacer feature and the second gate spacer feature, a first source/drain feature disposed over a first source/drain region of the active region, a second source/drain feature disposed over a second source/drain region of the active region, a dielectric layer over the first source/drain feature, a hard mask layer over the dielectric layer, and a source/drain contact over and in contact with the second source/drain feature. A top surface of the hard mask layer is coplanar with a top surface of the source/drain contact.

In some embodiments, the dielectric layer includes silicon oxide and the first gate spacer feature, and the second gate spacer feature, the gate-top dielectric feature, and the hard mask layer include silicon nitride. In some embodiments, the gate-top dielectric feature includes a lower portion and an upper portion over the lower portion, the lower portion is disposed between the dielectric layer and the source/drain contact, and the upper portion is disposed between the hard mask layer and the source/drain contact. In some implementations, the channel region of the active region includes a fin-like structure. In some instances, the channel region of the active region includes a vertical stack of nanostructures and the gate structure wraps around each of the vertical stack of nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure disposed over a channel region of an active region;
   a first gate spacer feature disposed along a first sidewall of the gate structure;
   a second gate spacer feature disposed along a second sidewall of the gate structure, the second sidewall opposing the first sidewall;
   a gate-top dielectric feature over the gate structure, the first gate spacer feature and the second gate spacer feature;
   a first source/drain feature disposed over a first source/drain region of the active region;
   a second source/drain feature disposed over a second source/drain region of the active region;
   a dielectric layer over the first source/drain feature;
   a hard mask layer directly over a top surface of the dielectric layer, wherein the hard mask layer spans a substantial width of the first source/drain feature; and
   a source/drain contact over and in contact with the second source/drain feature,
   wherein a top surface of the hard mask layer is coplanar with a top surface of the source/drain contact.

2. The semiconductor device of claim 1,
   wherein the dielectric layer comprises silicon oxide,
   wherein the first gate spacer feature, and the second gate spacer feature, the gate-top dielectric feature, and the hard mask layer comprise silicon nitride.

3. The semiconductor device of claim 1,
   wherein the gate-top dielectric feature comprises a lower portion and an upper portion over the lower portion,
   wherein the lower portion is disposed between the dielectric layer and the source/drain contact,
   wherein the upper portion is disposed between the hard mask layer and the source/drain contact.

4. The semiconductor device of claim 1, wherein the channel region of the active region comprises a fin-like structure.

5. The semiconductor device of claim 1, wherein the channel region of the active region comprises a vertical stack of nanostructures and the gate structure wraps around each of the vertical stack of nanostructures.

6. A semiconductor structure, comprising:
   a first source/drain feature and a second source/drain feature;
   a channel region disposed between the first source/drain feature and the second source/drain feature;
   a metal gate structure disposed directly over the channel region;
   a first dielectric layer disposed directly over the metal gate structure;
   a second dielectric layer disposed directly over the first source/drain feature;
   a third dielectric layer disposed directly over the second dielectric layer;
   a source/drain contact disposed directly over the second source/drain feature;
   a first gate spacer extending between the metal gate structure and the second dielectric layer, the first dielectric layer and the second dielectric layer, and the first dielectric layer and the third dielectric layer, wherein a top surface of the first dielectric layer is higher than a top surface of the second dielectric layer;
   a second gate spacer extending between the metal gate structure and the source/drain contact and between the source/drain contact and the first dielectric layer; and
   a contact etch stop layer disposed between the second dielectric layer and the first source/drain feature, between the second dielectric layer and the first gate spacer, between the third dielectric layer and the first gate spacer, and between the third dielectric layer and the first dielectric layer.

7. The semiconductor structure of claim 6, wherein a top portion of the first dielectric layer is partially disposed on a top surface of the first gate spacer and a top surface of the second gate spacer.

8. The semiconductor structure of claim 6, wherein a bottom surface of the third dielectric layer is lower than a top surface of the first gate spacer.

9. The semiconductor structure of claim 6, wherein the first dielectric layer comprises silicon nitride.

10. The semiconductor structure of claim 6, wherein a composition of the second dielectric layer is different from a composition of the third dielectric layer.

11. The semiconductor structure of claim 10,
    wherein the second dielectric layer comprises silicon oxide, porous organosilicate, tetraethylorthosilicate oxide, un-doped silicate glass, borophosphosilicate glass, fused silica glass, phosphosilicate glass, fluorine-doped silicon dioxide, carbon-doped silicon dioxide, porous silicon dioxide, porous carbon-doped silicon dioxide, silicon carbon nitride (SiCN), silicon oxycarbide (SiOCN), or a silicon based polymer,
    wherein the third dielectric layer comprises silicon nitride, silicon, silicon carbide, silicon oxycarbonitride, or silicon carbonitride.

12. The semiconductor structure of claim 6, wherein the third dielectric layer comprises tapering sidewalls.

13. The semiconductor structure of claim 12, wherein a bottom surface of the third dielectric layer is lower than a top surface of the metal gate structure.

14. The semiconductor structure of claim 12, wherein a portion of the second dielectric layer is disposed between the first gate spacer and the third dielectric layer.

15. A semiconductor structure, comprising:
    a source/drain feature disposed over a source/drain region of an active region;
    a gate structure disposed over a channel region of the active region, the channel region being adjacent the source/drain region;
    a first dielectric layer disposed directly over the gate structure;
    a second dielectric layer disposed directly over the source/drain feature;
    a third dielectric layer disposed directly over and in contact with a top surface of the second dielectric layer; and
    a gate spacer extending between the gate structure and the second dielectric layer, the first dielectric layer and the second dielectric layer, and the first dielectric layer and the third dielectric layer,
    wherein the second dielectric layer comprises silicon oxide or a low-k dielectric material,
    wherein the third dielectric layer comprises silicon nitride, silicon, silicon carbide, silicon oxycarbonitride, or silicon carbonitride,
    wherein a bottom surface of the third dielectric layer is lower than a top surface of the gate spacer.

16. The semiconductor structure of claim 15, wherein a portion of the first dielectric layer is partially disposed on a top surface of the gate spacer.

17. The semiconductor structure of claim 15, wherein the third dielectric layer comprises tapering sidewalls.

18. The semiconductor structure of claim 17, wherein a portion of the second dielectric layer is disposed between the gate spacer and the third dielectric layer.

19. The semiconductor structure of claim 15,
    wherein the first dielectric layer comprises a lower portion and an upper portion over the lower portion,
    wherein the lower portion is disposed directly across the second dielectric layer over the gate spacer,
    wherein the upper portion is disposed directly across the third dielectric layer over the gate spacer.

* * * * *